United States Patent
Liang et al.

(10) Patent No.: US 11,942,779 B2
(45) Date of Patent: Mar. 26, 2024

(54) SHUTDOWN MODE FOR BANDGAP AND BIAS CIRCUIT WITH VOLTAGE COMPARATOR TO REDUCE LEAKAGE CURRENT

(71) Applicant: SKYWORKS SOLUTIONS, INC., Irvine, CA (US)

(72) Inventors: Bang Li Liang, Ottawa (CA); Tom Taoufik Bourdi, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 730 days.

(21) Appl. No.: 17/082,147

(22) Filed: Oct. 28, 2020

(65) Prior Publication Data

US 2021/0132642 A1 May 6, 2021

Related U.S. Application Data

(60) Provisional application No. 63/064,042, filed on Aug. 11, 2020, provisional application No. 62/927,752, filed on Oct. 30, 2019.

(51) Int. Cl.
*H03K 19/20* (2006.01)
*G01R 19/165* (2006.01)
(Continued)

(52) U.S. Cl.
CPC ....... *H02H 9/025* (2013.01); *G01R 19/16538* (2013.01); *H03K 17/22* (2013.01); *H03K 19/0016* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 6,031,778 A | * | 2/2000 | Makino | G11C 7/065 365/189.11 |
| 7,450,361 B2 | * | 11/2008 | Ito | H03K 17/163 361/93.1 |

(Continued)

FOREIGN PATENT DOCUMENTS

| | | |
|---|---|---|
| KR | 10-2009-0048295 A | 5/2009 |
| WO | 2007035724 A2 | 3/2007 |
| WO | 2017093911 A1 | 6/2017 |

OTHER PUBLICATIONS

International Search Report and Written Opinion from International Application No. PCT/US2021/026404 dated Jul. 23, 2021.

*Primary Examiner* — Jeffery S Zweizig
(74) *Attorney, Agent, or Firm* — Lando & Anastasi, LLP

(57) ABSTRACT

According to at least one aspect, a controller having a mode of operation including one of an on mode and an off mode is provided including a voltage supply node, a mode of operation signal node, a powered component, a switching device coupled in series between the voltage supply node and the powered component, a power supply detector coupled to the switching circuit, the voltage supply node, and the mode of operation signal node, the power supply detector being configured to receive a mode of operation signal indicative of the mode of operation of the controller from the mode of operation signal node, determine that the controller is in the off mode based on the mode of operation signal, and control the switching device to prevent a current from passing from the voltage supply node to the powered component responsive to determining that the controller is in the off mode.

20 Claims, 6 Drawing Sheets

(51) Int. Cl.
*H02H 9/02* (2006.01)
*H03K 17/22* (2006.01)
*H03K 19/00* (2006.01)

(56) References Cited

U.S. PATENT DOCUMENTS

| | | |
|---|---|---|
| 7,602,236 B2 | 10/2009 | Jo |
| 8,008,966 B2 | 8/2011 | Cho |
| 8,704,588 B2 | 4/2014 | Conte et al. |
| 9,917,577 B1 * | 3/2018 | Rezayee ............... G05F 1/46 |
| 10,522,196 B2 | 12/2019 | Yang et al. |
| 11,127,437 B2 | 9/2021 | Lin et al. |
| 2004/0257150 A1 | 12/2004 | Farooqui |
| 2017/0160763 A1 | 6/2017 | Barbelenet |
| 2019/0025868 A1 | 1/2019 | Segarra |
| 2020/0401177 A1 | 12/2020 | Liang |
| 2021/0318708 A1 | 10/2021 | Liang et al. |

* cited by examiner

SHUTDOWN MODE FOR BANDGAP AND BIAS CIRCUIT WITH VOLTAGE COMPARATOR TO REDUCE LEAKAGE CURRENT

CROSS-REFERENCE TO RELATED APPLICATIONS

This application claims priority under 35 U.S.C. § 119(e) to U.S. Provisional Patent Application No. 62/927,752, titled SHUTDOWN MODE FOR BANDGAP AND BIAS CIRCUIT WITH VOLTAGE COMPARATOR TO REDUCE LEAKAGE CURRENT, filed Oct. 30, 2019, and to U.S. Provisional Patent Application No. 63/064,042, titled SHUTDOWN MODE FOR BANDGAP AND BIAS CIRCUIT WITH VOLTAGE COMPARATOR TO REDUCE LEAKAGE CURRENT, filed Aug. 11, 2020, the content of which is incorporated herein in its entirety for all purposes.

BACKGROUND

1. Field of the Disclosure

At least one example in accordance with the present disclosure relates generally to reducing leakage current in a front end module, such as a power amplifier module.

2. Discussion of Related Art

The Internet of Things (IoT) refers to a system of inter-related devices, including computing devices, that are capable of communicating via a network, such as the Internet. IoT devices may communicate pursuant to radio technology standards, such as the Narrowband Internet of Things (NB-IoT) low power wide area network radio technology standard. Certain narrowband categories are defined by NB-IoT, such as Cat NB1. Devices implemented in Cat NB1 applications may be subject to strict design requirements, including low off-state current requirements and fast wakeup time requirements.

SUMMARY

According to at least one aspect of the present disclosure a controller having a mode of operation including one of an on mode and an off mode is provided, the controller including a voltage supply node, a mode of operation signal node, a powered component, a switching device coupled in series between the voltage supply node and the powered component, a power supply detector coupled to the switching circuit, the voltage supply node, and the mode of operation signal node, the power supply detector being configured to receive a mode of operation signal indicative of the mode of operation of the controller from the mode of operation signal node, determine that the controller is in the off mode based on the mode of operation signal, and control the switching device to prevent a current from passing from the voltage supply node to the powered component responsive to determining that the controller is in the off mode.

In various examples, the power supply detector is further configured to control the switching device to prevent a current in excess of 1 µA from passing from the voltage supply node to the powered component responsive to determining that the controller is in the off mode. In at least one example, the power supply detector is further configured to determine, based on the mode of operation signal, that the controller is in the on mode, receive a first voltage signal from the voltage supply node, determine that a magnitude of the first voltage signal is below a voltage threshold value, and control the switching device to prevent a current from passing from the voltage supply node to the powered component responsive to determining that the magnitude of the voltage signal is below the voltage threshold value.

In some examples, the power supply detector is further configured to determine, based on the mode of operation signal, that the controller is in the on mode, receive a second voltage signal from the voltage supply node, determine that a magnitude of the second voltage signal is above a voltage threshold value, and control the switching device to allow a current to pass from the voltage supply node to the powered component responsive to determining that the magnitude of the second voltage signal is above the voltage threshold value. In at least one example, the power supply detector is further configured to determine, based on the mode of operation signal, that the controller is in the on mode, and control the switching device to allow a current to pass from the voltage supply node to the powered component responsive to determining that the controller is in an on mode.

In various examples, the power supply detector is configured to control the switching device to allow a current to pass from the voltage supply node to the powered component such that the switching device allows a current to pass from the voltage supply node to the powered component within 30 µs of receiving the mode of operation signal. In at least one example, the power supply detector includes a NAND gate having a first input configured to receive the mode of operation signal, a second input configured to receive a voltage signal from the voltage supply node, and an output configured to provide a control signal to an output of the power supply detector. In at least one example, the switching device is a p-channel field-effect transistor (PFET). In various examples, the PFET includes a first connection coupled to the voltage supply node, a second connection coupled to the powered component, and a control connection coupled to the output of the power supply detector.

According to at least one aspect, a method of operating a controller having a voltage supply node, a switching device, a powered component, and a mode of operation including one of an on mode and an off mode is provided, the method comprising receiving a mode of operation signal indicative of the mode of operation of the controller, determining that the controller is in the off mode based on the mode of operation signal, and controlling the switching device to prevent a current from passing from the voltage supply node to the powered component responsive to determining that the controller is in the off mode.

In various examples, the method includes controlling the switching device to prevent a current in excess of 1 µA from passing from the voltage supply node to the powered component responsive to determining that the controller is in the off mode. In at least one example, the method further comprises determining, based on the mode of operation signal, that the controller is in the on mode, receiving a first voltage signal from the voltage supply node, determining that a magnitude of the first voltage signal is below a voltage threshold value, and controlling the switching device to prevent a current from passing from the voltage supply node to the powered component responsive to determining that the magnitude of the voltage signal is below the voltage threshold value.

In at least one example, the method includes determining, based on the mode of operation signal, that the controller is in the on mode, receiving a second voltage signal from the voltage supply node, determining that a magnitude of the second voltage signal is above a voltage threshold value, and controlling the switching device to allow a current to pass from the voltage supply node to the powered component responsive to determining that the magnitude of the second voltage signal is above the voltage threshold value. In various examples, the method includes determining, based on the mode of operation signal, that the controller is in the on mode, and controlling the switching device to allow a current to pass from the voltage supply node to the powered component responsive to determining that the controller is in an on mode.

In various examples, the method includes controlling the switching device to allow a current to pass from the voltage supply node to the powered component such that the switching device allows a current to pass from the voltage supply node to the powered component within 30 µs of receiving the mode of operation signal. In at least one example, the method includes allowing, by the switching device, a current to pass from the voltage supply node to the powered component in the absence of a biasing signal. In some examples, the method includes providing, by the power supply detector, the biasing signal to the switching device to prevent the switching device from allowing a current to pass from the voltage supply node to the powered component.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
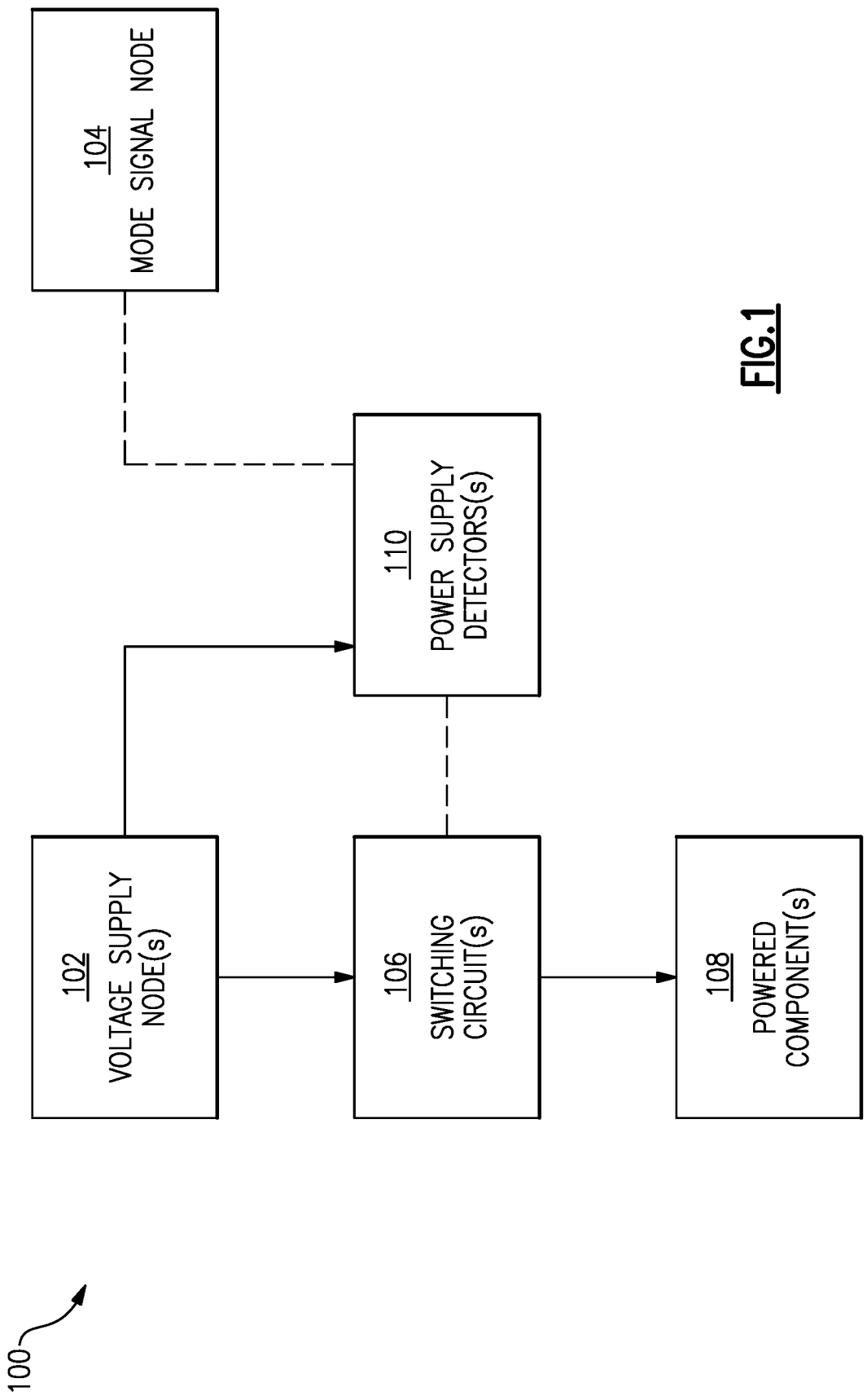
FIG. 1 illustrates a block diagram of certain components of a controller according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

As discussed above, devices implemented for use in Cat NB1 low-data-rate applications may be subject to strict design requirements. For example, controllers implemented for use in Cat NB1 low-data-rate applications may have ultra-low off-state current requirements and fast wakeup time requirements from an off state to a transmitting (TX) or receiving (RX) state. In one example, an off-state current requirement may be limited to less than 400 nA in a nominal case, and less than 1 µA over process, voltage, and temperature (PVT). In another example, a wakeup time requirement from an off state to a TX or RX state may be limited to less than 30 µs.

Generally speaking, a wakeup time of a device may be inversely proportional to a current consumed by the device. Accordingly, decreasing a device's off-state current may be in tension with reducing the wakeup time of the device. Thus, adhering to the design requirements of controllers implemented in Cat NB1 low-data-rate applications may be difficult where wakeup time and off-state current are in tension.

Accordingly, it may be beneficial to provide a controller that is capable of providing both an ultra-low off-state current and fast wakeup times discussed above. In one example, a controller implements a shutdown operation to physically shut down current paths throughout the controller which might otherwise conduct high off-state leakage currents. For example, such current paths may include a battery supply voltage source and certain modules or components which otherwise might conduct high leakage off-state currents, such as a bandgap core, level shifter, power amplifier bias circuit, and so forth.

In one example, a switching circuit is implemented in a current path connecting the battery supply voltage source and at least one component or module, such as those discussed above. The switching circuit is configured to control a current between the battery supply voltage source and the at least one component or module. The switching circuit is, in turn, controlled by a control circuit configured to control the switching circuit based on a mode of operation of the controller (including, for example, an off mode, a TX mode, an RX mode, and so forth) and based on a battery supply voltage. In various examples, the switching circuit and the control circuit are implemented using components that respond quickly to changes in the mode of operation of the controller to reduce a wakeup time of the controller.

An example of the foregoing is provided with respect to FIG. 1. FIG. 1 illustrates a block diagram of certain components of a controller 100 according to an example. The controller 100 includes one or more voltage supply nodes 102, a mode of operation node 104, one or more switching circuits 106, one or more powered components 108, and one or more power supply detectors 110. The controller 100 is configured to operate in at least two modes of operation, including an off mode and an on mode, where the on mode may include one of a TX state and an RX state. It may be beneficial to reduce a leakage current consumed by the powered component(s) 108 and reduce a wakeup time of the powered component(s) 108 for the reasons discussed above.

The voltage supply node(s) 102 are electrically coupled to the switching circuit(s) 106 and the power supply detector(s) 110, and are configured to be electrically coupled to a voltage source, such as a battery. The mode of operation node 104 is electrically coupled to the power supply detector(s) 110, and is configured to be electrically coupled to a mode of operation signal source to provide the mode of operation signal to the power supply detector(s) 110. The switching circuit(s) 106 are electrically coupled to the voltage supply node(s) 102, the powered component(s) 108, and to the power supply detector(s) 110. The powered component(s) 108 are electrically coupled to the switching circuit(s) 106. The power supply detector(s) 110 are electrically coupled to the voltage supply node(s) 102, the mode of operation node 104, and to the switching circuit(s) 106.

It may be beneficial to minimize a leakage current consumption by the powered component(s) 108 from the voltage supply node(s) 102 while the controller 100 is in the off mode, or when an adequate supply voltage is not provided by the voltage supply node(s) 102. As discussed in greater detail below, the power supply detector(s) 110 are configured to determine a mode of operation of the controller 100 based at least in part on a mode of operation signal received from the mode of operation node 104, and determine a supply voltage received from the voltage supply node(s) 102. Based on these values, the power supply detector(s) 110 are configured to control the switching circuit(s) 106.

The switching circuit(s) 106, in turn, control a current between the voltage supply node(s) 102 and the powered component(s) 108. In various examples, the switching circuit(s) 106 may include at least one voltage-controlled switching device, such as a p-channel field-effect transistor (referred to herein as a "PFET"), connected in series between the voltage supply node(s) 102 and the powered component(s) 108. In these examples, the switching circuit(s) 106 may allow a current to pass through the switching circuit(s) 106 when the PFET is in a closed and conducting position, and may prevent an appreciable current from passing through the switching circuit(s) 106 when the PFET is in an open and non-conducting position.

As discussed above, the switching circuit(s) 106 may be controlled by the power supply detector(s) 110. For example, where the switching circuit(s) 106 include voltage-controlled switching devices, the power supply detector(s) 110 may control a voltage on a control connection of the voltage-controlled switching devices (for example, a gate of a PFET) based on the signals received from the voltage supply node(s) 102 and from the mode of operation node 104. In various examples, the power supply detector(s) 110 may control the switching circuit(s) 106 by providing a high biasing current to enable fast wakeup times. Thus, the power supply detector(s) 110 may determine a mode of operation of the controller 100, and responsively control a state of the switching circuit(s) 106 to minimize power consumption and wakeup times.

Figure 2:
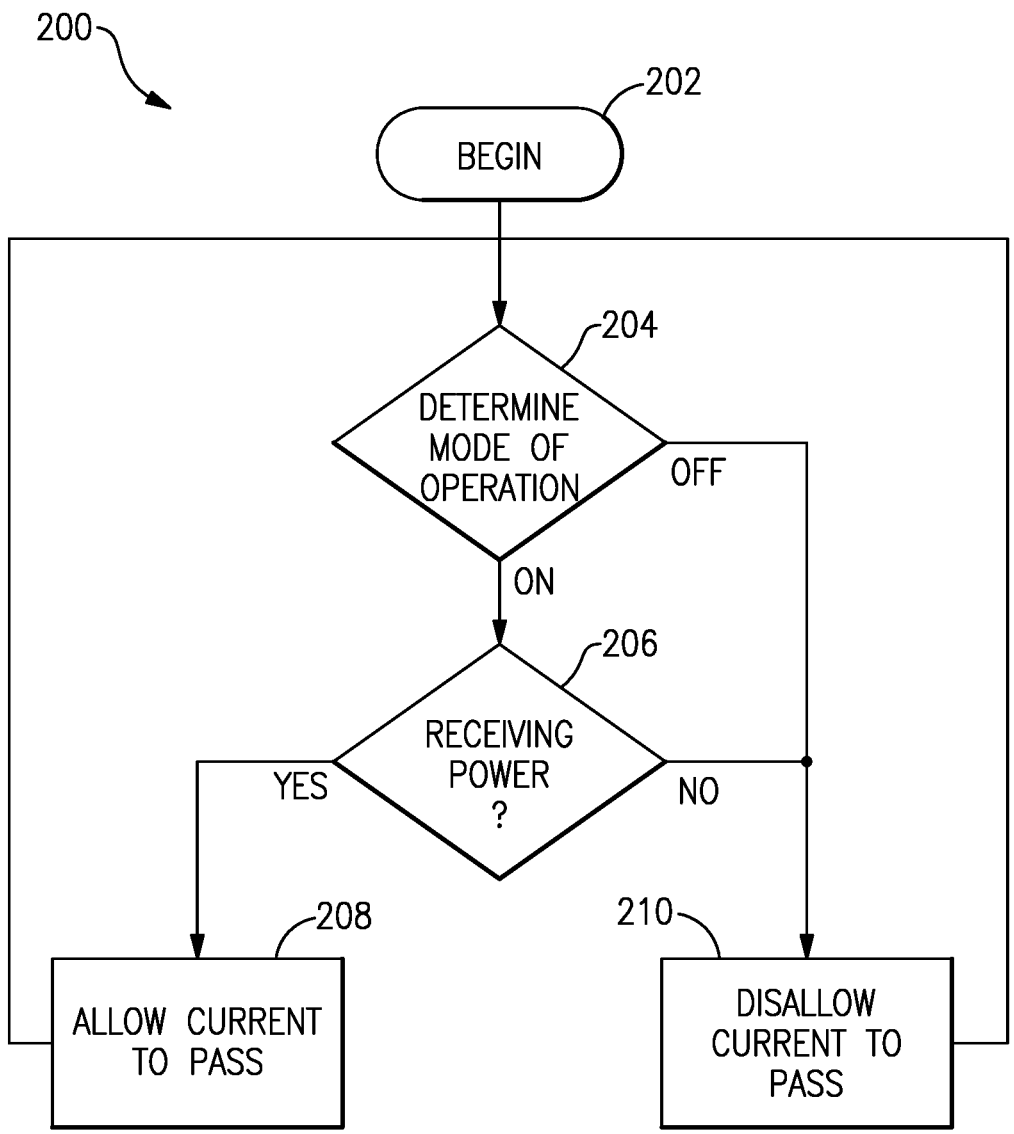
FIG. 2 illustrates a process of operating the controller according to an example.

To illustrate the foregoing principles, an example is provided with respect to FIG. 2. FIG. 2 illustrates a process 200 of operating the controller 100 according to an example.

At act 202, the process 200 begins.

At act 204, a determination is made by the power supply detector(s) 110 as to a mode of operation of the controller 100. For example, the determination may be made by the power supply detector(s) 110 based at least in part on a mode of operation signal received from the mode of operation node 104. The mode of operation signal may be a binary signal with a magnitude having one of a first value indicative of an off mode (for example, a logical LOW value), and a second value indicative of an on mode (for example, a logical HIGH value) which may, in turn, correspond to one of a TX state and an RX state. If the power supply detector(s) 110 determine, based on the mode of operation signal, that the controller 100 is in an on mode (204 ON), then the process 200 continues to act 206. Otherwise, if the power supply detector(s) 110 determine, based on the mode of operation signal, that the controller 100 is in an off mode (204 OFF), then the process 200 continues to act 210.

At act 206, a determination is made by the power supply detector(s) 110 as to whether an adequate supply voltage is being received from the voltage supply node(s) 102. In various examples, the power supply detector(s) 110 may implement a minimum voltage threshold value to determine if an adequate supply voltage is being received. That is, act 206 may include determining if a magnitude of a supply voltage received from the voltage supply node(s) 102 meets or exceeds the minimum voltage threshold value, which corresponds to a logical HIGH value. If the power supply detector(s) 110 determine that the adequate supply voltage is not being received from the voltage supply node(s) 102 (206 NO), then the process 200 continues to act 210. Otherwise, if the power supply detector(s) 110 determine that the adequate supply voltage is being received from the voltage supply node(s) 102 (206 YES), then the process 200 continues to act 208.

At act 208, upon determining that the controller 100 is in an on mode of operation and that an adequate supply voltage is being received, the power supply detector(s) 110 control the switching circuit(s) 106 to allow current to pass through the switching circuit(s) 106 from the voltage supply node(s) 102 to the powered component(s) 108. As discussed above, the switching circuit(s) 106 may include one or more voltage-controlled switches. Accordingly, controlling the switching circuit(s) 106 to allow current to pass through the switching circuit(s) 106 may include providing a biasing current to a control connection of the voltage-controlled switches such that the voltage-controlled switches are in a closed and conducting state. In another example, controlling the switching circuit(s) 106 to allow current to pass through the switching circuit(s) 106 may include withholding a biasing current to a controller connection of the voltage-controlled switches, such as examples in which the voltage-controlled switches are "normally on" switches which conduct in the absence of a bias signal.

As discussed above, in some examples, the power supply detector(s) 110 may provide a high biasing current to the switching circuit(s) 106. Providing a high biasing current may be particularly advantageous where the controller 100 is transitioning from an off mode to an on mode, at least because a high biasing current may expedite a switching time of the switching circuit(s) 106. Accordingly, controlling the switching circuit(s) 106 to allow the current to pass through the switching circuit(s) 106 may facilitate fast wakeup times where the mode of operation of the controller 100 transitions from the off mode to the on mode. The process 200 returns to act 204 from act 208.

If the power supply detector(s) 110 determine that the controller 100 is in an off mode of operation (204 OFF) or that an adequate supply voltage is not being received from the voltage supply node(s) 102 (206 NO), the process 200 continues to act 210. At act 210, the power supply detector(s) 110 control the switching circuit(s) 106 to disallow current to pass through the switching circuit(s) 106 from the voltage supply node(s) 102 to the powered component(s) 108. As discussed above, the switching circuit(s) 106 may include one or more voltage-controlled switches. Accordingly, controlling the switching circuit(s) 106 to disallow current to pass through the switching circuit(s) 106 may include providing a biasing current to a control connection of the voltage-controlled switches such that the voltage-controlled switch is in a closed and conducting state. In another example, controlling the switching circuit(s) 106 to disallow current to pass through the switching circuit(s) 106 may include withholding a biasing current to a controller connection of the voltage-controlled switches, such as examples in which the voltage-controlled switches are "normally off" switches that do not conduct in the absence of a bias signal. The process 200 returns to act 204 from act 210.

Accordingly, the process 200 may be repeatedly (for example, continuously, periodically, or aperiodically) executed by the power supply detector(s) 110 to control the switching circuit(s) 106 pursuant to a mode of operation of the controller 100. For example, and as discussed in greater detail below, the power supply detector(s) 110 may include one or more logic gates having at least one input connection to receive a mode of operation signal from the mode of operation node 104 such that the power supply detector(s) 110 responds quickly to changes in the mode of operation signal.

It is to be appreciated that each of the components 102, 106-110 may respectively include any number of components, including one component. For purposes of illustration, an example is provided with respect to FIGS. 3A-4 in which the voltage supply node(s) 102 include two voltage supply nodes, the switching circuit(s) 106 include three switching devices, the powered component(s) 108 include two powered components, and the power supply detector(s) 110 include two power supply detectors. In other examples, however, the components 102, 106-110 may include any other number of components, including one component, independent of a number of other components.

Figure 3A:
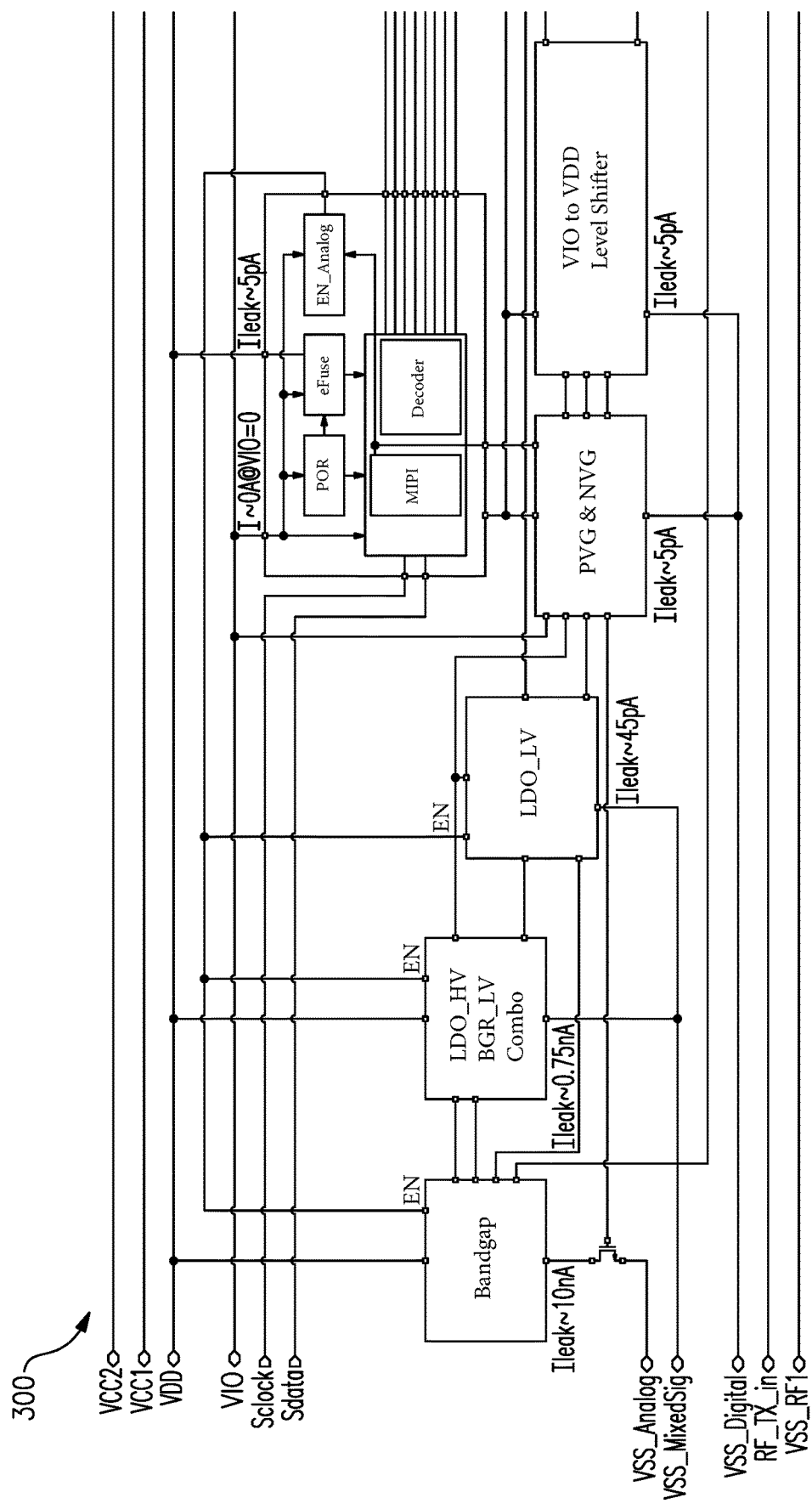
FIG. 3A illustrates a schematic diagram of a first portion of a controller topology according to an example.
Figure 3B:
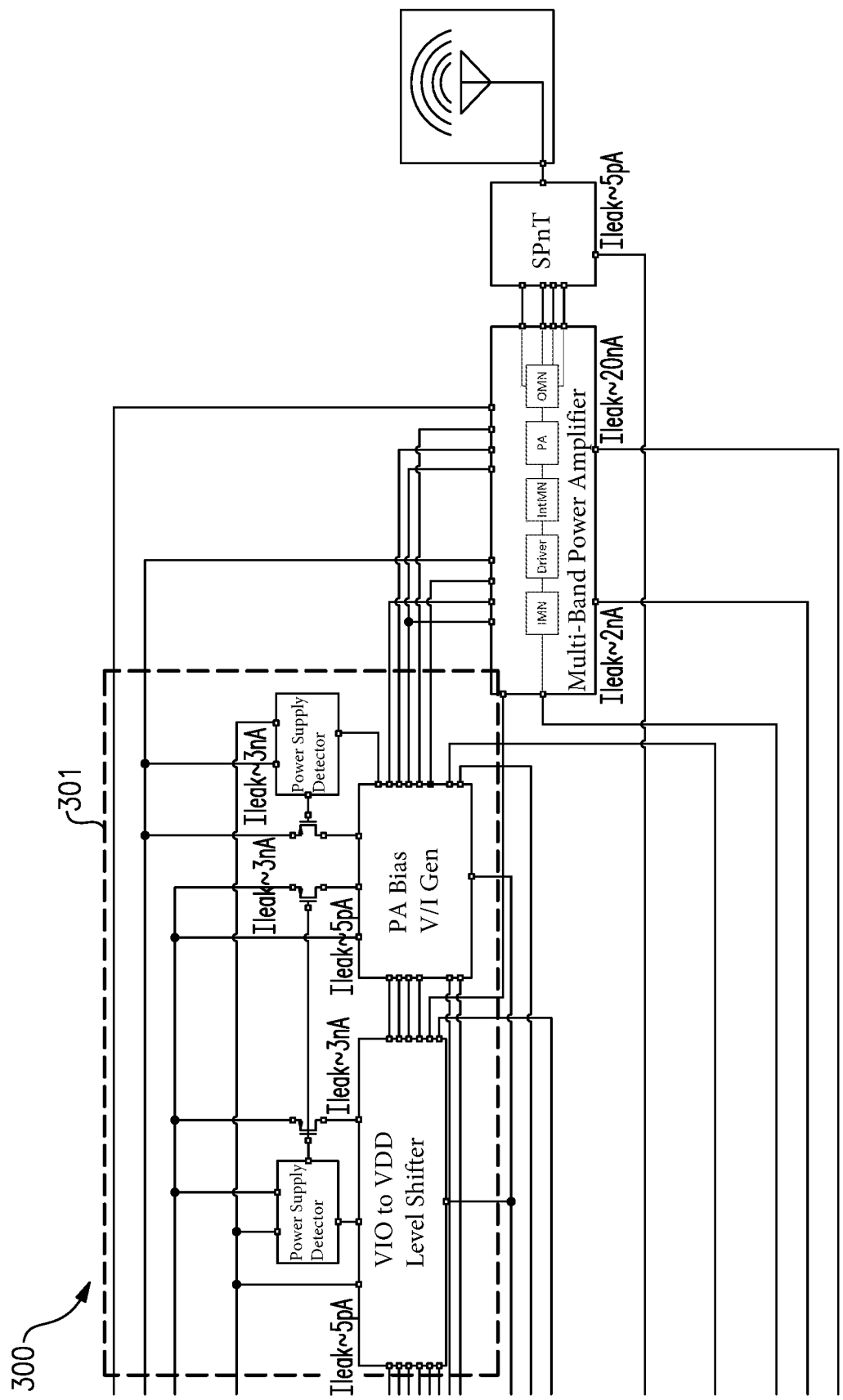
FIG. 3B illustrates a schematic diagram of a second portion of the controller topology according to an example.

FIGS. 3A-3B illustrate a schematic diagram of a controller 300 according to an example. It is to be appreciated that FIGS. 3A-3B collectively illustrate a single circuit topology that has been separated into two figures for clarity of illustration only. As discussed above, the controller 300 may be implemented in connection with an NB-IoT device. For example, the controller 300 may be configured to enable communication with external devices via a network connection, such as a wireless connection.

Certain aspects of the controller 300 be similar to, and illustrative of, certain aspects of the controller 100. Components of the controller 300 that may be similar to or illustrative of corresponding components of the controller 100 are indicated as such, as explained in greater detail below. More particularly, a first region 301 of the controller 300 includes components that may be similar to or illustrative of corresponding components of the controller 100. Accordingly, components within the first region 301 of the controller 300 are discussed in greater detail with respect to FIG. 4, which illustrates a schematic view of the first region 301 in greater detail.

Figure 4:
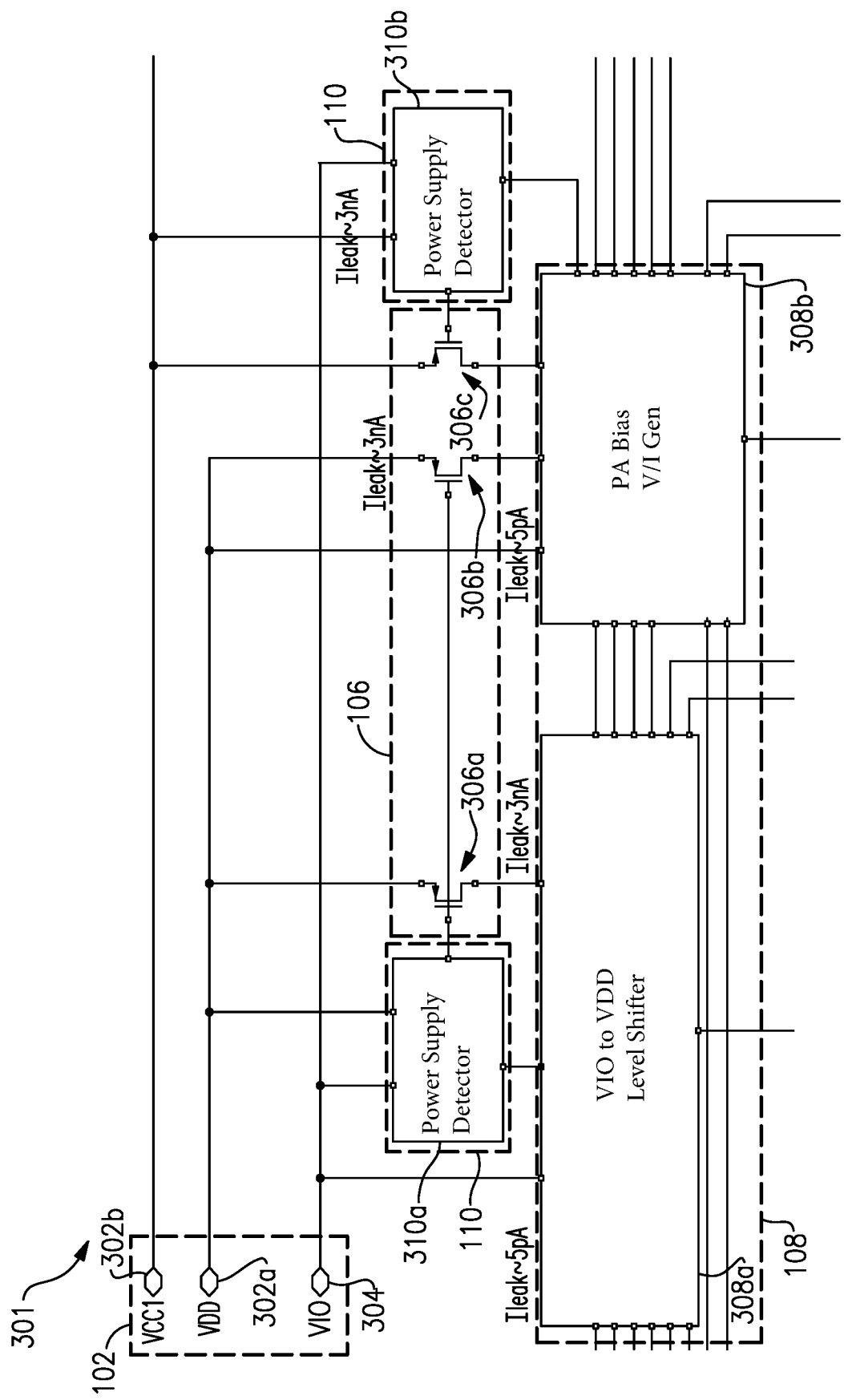
FIG. 4 illustrates a schematic diagram of a first region of the controller topology according to an example.

As illustrated in FIG. 4, the controller 300 includes a first voltage supply node 302a and a second voltage supply node 302b (collectively, "voltage supply nodes 302"); a mode of operation node 304; a first switching device 306a, a second switching device 306b, and a third switching device 306c (collectively, "switching devices 306"); a first powered component 308a and a second powered component 308b (collectively, "powered components 308"); and a first power supply detector 310a and a second power supply detector 310b (collectively, "power supply detectors 310").

The voltage supply nodes 302 may illustrate an example of the voltage supply node(s) 102. The mode of operation node 304 may illustrate an example of the mode of operation node 104. The switching devices 306 may illustrate an example of, or be included in an example of, the switching circuit(s) 106. The powered components 308 may illustrate an example of the powered component(s) 108. The power supply detectors 310 may illustrate an example of the power supply detector(s) 110.

The first voltage supply node 302a is electrically coupled to the first switching device 306a, the second switching device 306b, and the first power supply detector 310a, and is configured to be coupled to a first voltage supply providing a first supply voltage (referred to herein as "VDD"). The second voltage supply node 302b is electrically coupled to the third switching device 306c and the second power supply detector 310b, and is configured to be coupled to a second voltage supply providing a second supply voltage (referred to herein as "VCC1").

The mode of operation node 304 is electrically coupled to the power supply detectors 310, and is configured to be coupled to a source of a mode of operation signal. The mode of operation signal may be a binary signal with a magnitude having one of a first value (for example, a logical LOW value) indicative of an off mode of the controller 300, and a second value (for example, a logical HIGH value) indicative of an on mode of the controller 300.

The first switching device 306a is electrically coupled to the first voltage supply node 302a at a first connection, the first powered component 308a at a second connection, and the first power supply detector 310a at a control connection. The second switching device 306b is electrically coupled to the first voltage supply node 302a at a first connection, the second powered component 308b at a second connection, and the first power supply detector 310a at a control connection. The third switching device 306c is electrically coupled to the second voltage supply node 302b at a first connection, the second powered component 308b at a second connection, and the second power supply detector 310b at a control connection.

The first powered component 308a is electrically coupled to the first switching device 306a. The first powered component 308a may be electrically coupled to the first voltage supply node 302a via the first switching device 306a where the first switching device 306a is in a closed and conducting state. The second powered component 308b is electrically coupled to the second switching device 306b, and is electrically coupled to the third switching device 306c. The second powered component 308b may be electrically coupled to the first voltage supply node 302a via the second switching device 306b where the second switching device 306b is in a closed and conducting state, and may be electrically coupled to the second voltage supply node 302*b* via the third switching device 306*c* where the third switching device 306*c* is in a closed and conducting state.

The first power supply detector 310*a* is electrically coupled to the first voltage supply node 302*a*, the mode of operation node 304, and the control connection of each of the switching devices 306*a* and 306*b*. The second power supply detector 310*b* is electrically coupled to the second voltage supply node 302*b*, the mode of operation node 304, and the control connection of the third switching device 306*c*.

For purposes of clarity, certain connections are not specifically identified. That is, the example connections discussed above may not be an exhaustive list of connections between components of the controller 300.

Each of the power supply detectors 310*a*, 310*b* may independently execute the process 200 to control the switching devices 306*a*, 306*b* and the third switching device 306*c*, respectively. For example, and as discussed in greater detail below with respect to FIG. 5, the first power supply detector 310*a* may determine, at act 204, whether a mode of operation signal received from the mode of operation node 304 is indicative of an off state or an on state of the controller 300. If the mode of operation signal received from the mode of operation node 304 is indicative of the on state of the controller 300 (204 ON), then the process 200 continues to act 206. Otherwise, if the mode of operation signal received from the mode of operation node 304 is indicative of the off state of the controller (204 OFF), then the process 200 continues to act 210.

At act 206, the first power supply detector 310*a* determines whether an adequate supply voltage VDD is being provided by the first voltage supply node 302*a*. If so (206 YES), then the process 200 continues to act 208. At act 208, the first power supply detector 310*a* controls the switching devices 306*a*, 306*b* to allow current to conduct from the first voltage supply node 302*a* to the powered components 308 through the switching devices 306*a*, 306*b*. For example, the first power supply detector 310*a* may provide a biasing current to a control connection to one or both of the switching devices 306*a*, 306*b* (for example, where one or both of the switching devices 306*a*, 306*b* is normally off and thus conductive in the presence of a biasing current) or withhold a biasing current from a control connection of one or both of the switching devices 306*a*, 306*b* (for example, where one or both of the switching devices 306*a*, 306*b* is normally on and thus conductive in the absence of a biasing current). The process 200 then returns to act 204.

Otherwise, if the first power supply detector 310*a* determines that the mode of operation signal received from the mode of operation node 304 is indicative of the off state of the controller 300 (204 OFF), or that an adequate supply voltage VDD is not being provided by the first voltage supply node 302*a* (206 NO), then the process 200 continues to act 210. At act 210, the first power supply detector 310*a* controls the switching devices 306*a*, 306*b* to disallow current to conduct between the first voltage supply node 302*a* and the powered components 308 through the switching devices 306*a*, 306*b*. For example, the first power supply detector 310*a* may provide a biasing current to a control connection of one or both of the switching devices 306*a*, 306*b* (for example, where one or both of the switching devices 306*a*, 306*b* is normally on and thus non-conductive in the presence of a biasing current) or withhold a biasing current from a control connection of one or both of the switching devices 306*a*, 306*b* (for example, where one or both of the switching devices 306*a*, 306*b* is normally off and thus non-conductive in the absence of a biasing current). The process 200 then returns to act 204.

Although the foregoing example is provided with respect to the first power supply detector 310*a*, similar principles may apply to the second power supply detector 310*b*. For example, the second power supply detector 310*b* may execute the process 200 to control the third switching device 306*c* based on signals received from the second voltage supply node 302*b* and the mode of operation node 304.

Figure 5:
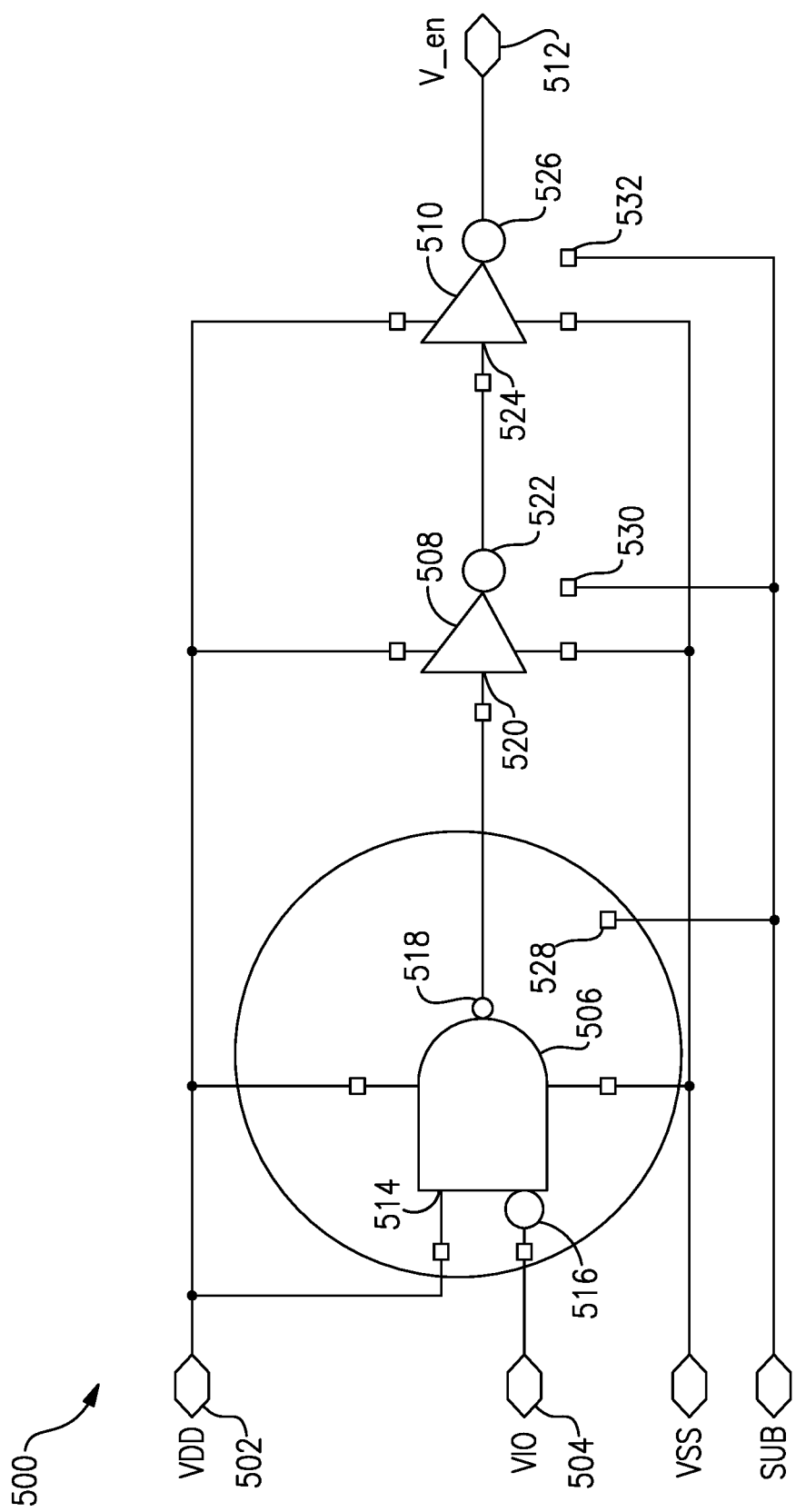
FIG. 5 illustrates a schematic diagram of a power supply detector according to an example.

For purposes of illustration, an example implementation of a power supply detector is provided with respect to FIG. 5. FIG. 5 illustrates a schematic diagram of a power supply detector 500 according to an example. For example, any of the power supply detectors 110, 310 may be implemented in connection with the topology of the power supply detector 500. The power supply detector 500 includes a voltage supply node input 502, a mode of operation signal input 504, a first logic component 506, a second logic component 508, a third logic component 510, and a power supply detector output 512. The first logic component 506 includes a first input 514, a second input 516, and an output 518. The second logic component 508 includes an input 520 and an output 522. The third logic component 510 includes an input 524 and an output 526. Furthermore, the first logic component 506 includes a first substrate connection 528, the second logic component 508 includes a second substrate connection 530, and the third logic component 510 includes a third substrate connection 532, each of which is configured to be coupled to a substrate (or "SUB") input to connect to a silicon substrate in which the logic components are implemented. In some examples, such as in silicon-on-insulator ("SOT") implementations, the SUB input may be floating, or grounded (that is, shorted to VSS).

The voltage supply node input 502 is coupled to the first input 514 of the first logic component 506, and is configured to be coupled to a voltage supply node, such as one of the voltage supply nodes 102, 302. The mode of operation signal input 504 is coupled to the second input 516 of the first logic component 506, and is configured to be coupled to a mode of operation node, such as one of the mode of operation nodes 104, 304.

The first input 514 of the first logic component 506 is coupled to the voltage supply node input 502, and is configured to receive a supply voltage from the voltage supply node input 502. The second input 516 of the first logic component 506 is coupled to the mode of operation signal input 504, and is configured to receive a mode of operation signal from the mode of operation signal input 504. The output 518 of the first logic component 506 is coupled to the input 520 of the second logic component 508, and is configured to provide an output signal to the input 520 of the second logic component 508 based on signals received at the inputs 514, 516.

The input 520 of the second logic component 508 is coupled to the output 518 of the first logic component 506, and the output 522 of the second logic component 508 is coupled to the input 524 of the third logic component 510. The second logic component 508 is configured to receive an input signal from the first logic component 506 at the input 520, and provide an output signal to the input 524 of the third logic component 510 from the output 522 based on the input signal received from the first logic component 506.

The input 524 of the third logic component 510 is coupled to the output 522 of the second logic component 508, and the output 526 of the third logic component 510 is coupled to the power supply detector output 512. The third logic component 510 is configured to receive an input signal from the second logic component 508 at the input 524, and provide an output signal to the power supply detector output 512 based on the input signal received from the second logic component 508.

In various examples, the power supply detector 500 is configured to provide an output signal at the power supply detector output 512 based on input signals received at the voltage supply node input 502 and the mode of operation signal input 504. The power supply detector output 512 may be coupled to a control connection of at least one switching device. Thus, the power supply detector 500 may control a switching state of at least one switching device based on input signals received at the voltage supply node input 502 and the mode of operation signal input 504.

More particularly, one of ordinary skill in the art will recognize the first logic component 506 as a NAND gate, and the second logic component 508 and the third logic component 510 as inverters collectively acting as an output buffer to the power supply detector output 512. That is, an output signal at the output 518 of the first logic component 506 may have the same logical value as an output signal at the power supply detector output 512.

The first logic component 506 may be designed to interpret voltages having magnitudes above a certain value as a logical HIGH value, and having magnitudes below the certain value as a logical LOW value. For example, the first logic component 506 may be designed to interpret magnitudes of voltage values received from the voltage supply node input 502 above the adequate supply voltage value as a logical HIGH value, and magnitudes of voltage values received from the voltage supply node input 502 below the adequate supply voltage value as a logical LOW value.

In various examples, the first logic component 506 may be an asymmetrical NAND gate. An asymmetrical NAND gate is a NAND gate in which a logical effort for one input differs from a logical effort of the other input. This feature may be leveraged to decrease a leakage current of the first logic component 506 and increase a speed at which the first logic component 506 responds to changing input conditions. For example, the second input 516 may be configured to respond more quickly to a changing input condition than the first input 514 as a result of the asymmetry of the NAND gate. In other examples, the first input 514 may respond more quickly than the second input 516.

TABLE 1 illustrates output signal values provided by the power supply detector 500 to the power supply detector output 512 based on input signals received at the voltage supply node input 502 and the mode of operation signal input 504. In summary, the power supply detector 500 is configured to provide a logical LOW, or "0," output signal to the power supply detector output 512 where an logical HIGH, or "1," input signal is received at both of the inputs 502, 504, and to otherwise provide a logical HIGH, or "1," output signal to the power supply detector output 512 for all other input value combinations. It is to be appreciated that a logical HIGH value at the voltage supply node input 502 may correspond to a first threshold voltage value and a logical HIGH value of the mode of operation signal input 504 may correspond to a second threshold value, different than the first threshold voltage value.

TABLE 1

Power Supply Detector 500 Truth Table

| Signal at Voltage Supply Node Input 502 | Signal at Mode of Operation Signal Input 504 | Signal at Power Supply Detector Output 512 |
|---|---|---|
| 0 | 0 | 1 |
| 0 | 1 | 1 |
| 1 | 0 | 1 |
| 1 | 1 | 0 |

For example, the power supply detector 500 may be an example of, or included in, the power supply detectors 310. Using the first power supply detector 310a as an example, the voltage supply node input 502 may be coupled to the first voltage supply node 302a, the mode of operation signal input 504 may be coupled to the mode of operation node 304, and the power supply detector output 512 may be coupled to the control connection of the first switching device 306a and to the control connection of the second switching device 306b. Similar principles apply to examples of the second power supply detector 310b, which may be coupled to the second voltage supply node 302b, the mode of operation node 304, and the control connection of the third switching device 306c.

A topology of the power supply detectors 310 may vary based on a device type of the switching devices 306. In examples in which the switching devices 306 are implemented as PFET switching devices, for example, it is to be appreciated that the switching devices 306 are normally closed and conducting devices that enter an open and non-conducting state responsive to receiving a biasing current on a control terminal of the switching devices 306. As discussed above, it may be beneficial for the power supply detectors 310 to control the switching devices 306 to conduct (that is, by providing a logical LOW signal to the control connections of the switching devices 306) if both the supply voltage and mode of operation signal are at a logical HIGH value, and to otherwise control the switching devices 306 not to conduct (that is, by providing a logical HIGH signal to the control connections of the switching devices 306). Accordingly, the power supply detectors 310 may be implemented using a topology such as that of the power supply detector 500 at least because, as indicated in TABLE 1, the power supply detector 500 is configured to meet these output signal logical requirements.

Accordingly, examples have been provided in which a leakage current to components such as the powered components 108, 308 is minimized (for example, limited to less than 400 nA in a nominal case, and less than 1 μA over PVT). The switching circuit(s) 106 and/or switching devices 306, in combination with the power supply detectors 110, 310, prevent a significant leakage current from being consumed by the powered components 108, 308 while the powered components 108, 308 are off or otherwise not in a fully on mode of operation. When the powered components 108, 308 awaken, the power supply detectors 110, 310 control the switching circuit(s) 106 and/or switching devices 306 such that the switching circuit(s) 106 and/or switching devices 306 may quickly transition to a closed and conducting mode to expedite the wakeup process (for example, by limiting the wakeup time to less than 30 μs). Accordingly, examples advantageously provide herein minimize both current consumption and a component wakeup time.

It is to be appreciated that certain examples have been provided for purposes of illustration only. For example, although the switching devices 306 are illustrated as PFET-type switching devices, other types of switching devices may be implemented. For example, one or more of the switching devices 306 may be implemented as an n-channel field-effect transistor (NFET) switching device, a bipolar junction transistor, and so forth.

Similarly, although FIG. 5 provides an example topology of a power supply detector 500 as an example of the power supply detectors 110, 310, other examples are within the scope of the disclosure. For example, a topology of the power supply detectors 110, 310 may be implemented based at least in part on an implementation of the switching circuit(s) 106 and/or switching devices 306 to which the power supply detectors 110, 310 are coupled. For example, whereas the output signals provided by the power supply detector 500 as detailed above with respect to TABLE 1 may be appropriate where the switching devices 306 are implemented as PFET-type devices, the output signals may not be appropriate where the switching devices 306 are implemented as NFET-type devices. For example, it may be beneficial to implement the first logic component 506 with an AND gate rather than a NAND gate where a switching device to which the power supply detector output 512 is coupled is implemented as an NFET-type device.

Furthermore, it is to be appreciated that, where the power supply detector(s) 110 include more than one power supply detector, not every one of the power supply detector(s) 110 may have an identical or substantially similar topology. For example, a first one of the power supply detector(s) 110 may include an AND gate, whereas a second one of the power supply detector(s) 110 may include a NAND gate. Similar principles apply to the switching circuit(s) 106, such that a first one of the switching circuit(s) 106 may be implemented as a PFET-type switching device, and a second one of the switching circuit(s) 106 may be implemented as an NFET-type switching device.

As discussed above, the components 102, 106-110 may include any number of components, regardless of a number of other components. Accordingly, it is to be appreciated that the examples provided in connection with FIGS. 3A-5 are provided for purposes of explanation only, and are not intended to be limiting.

Furthermore, although examples provided herein may include components of a controller, such as the controllers 100, 300, it is to be appreciated that the principles disclosed herein may be applicable to other circuit topologies. For example, examples provided herein may be applicable in reducing a leakage current and wakeup time of any powered components operating in any other circuit topologies. Accordingly, no limitation is implied by the examples provided above with respect to controller topologies.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A controller having a mode of operation including one of an on mode and an off mode, the controller comprising:
    a voltage supply node;
    a mode of operation signal node;
    a powered component;
    a switching device coupled in series between the voltage supply node and the powered component; and
    a power supply detector coupled to the switching device, the voltage supply node, and the mode of operation signal node, the power supply detector being configured to
        receive a mode of operation signal indicative of the mode of operation of the controller from the mode of operation signal node,
        determine that the controller is in the off mode based on the mode of operation signal, and
        control the switching device to prevent a current from passing from the voltage supply node to the powered component responsive to determining that the controller is in the off mode.

2. The controller of claim 1 wherein the power supply detector is further configured to control the switching device to prevent a current in excess of 1 µA from passing from the voltage supply node to the powered component responsive to determining that the controller is in the off mode.

3. The controller of claim 1 wherein the power supply detector is further configured to:
    determine, based on the mode of operation signal, that the controller is in the on mode;
    receive a first voltage signal from the voltage supply node;
    determine that a magnitude of the first voltage signal is below a voltage threshold value; and
    control the switching device to prevent a current from passing from the voltage supply node to the powered component responsive to determining that the magnitude of the voltage signal is below the voltage threshold value.

4. The controller of claim 3 wherein the power supply detector is further configured to:
    determine, based on the mode of operation signal, that the controller is in the on mode;
    receive a second voltage signal from the voltage supply node;
    determine that a magnitude of the second voltage signal is above the voltage threshold value; and
    control the switching device to allow a current to pass from the voltage supply node to the powered component responsive to determining that the magnitude of the second voltage signal is above the voltage threshold value.

5. The controller of claim 1 wherein the power supply detector is further configured to:
    determine, based on the mode of operation signal, that the controller is in the on mode; and
    control the switching device to allow a current to pass from the voltage supply node to the powered component responsive to determining that the controller is in the on mode.

6. The controller of claim 5 wherein the power supply detector is configured to control the switching device to allow a current to pass from the voltage supply node to the powered component such that the switching device allows a current to pass from the voltage supply node to the powered component within 30 µs of receiving the mode of operation signal.

7. The controller of claim 1 wherein the power supply detector includes a NAND gate having:
    a first input configured to receive the mode of operation signal;
    a second input configured to receive a voltage signal from the voltage supply node; and
    an output configured to provide a control signal to an output of the power supply detector.

8. The controller of claim 7 wherein the switching device is a p-channel field-effect transistor (PFET).

9. The controller of claim 8 wherein the PFET includes:
a first connection coupled to the voltage supply node;
a second connection coupled to the powered component; and
a control connection coupled to the output of the power supply detector.

10. The controller of claim 7 wherein the NAND gate is an asymmetrical NAND gate.

11. The controller of claim 10 wherein the first input responds more quickly to a change in the mode of operation signal than the second input responds to changes in the voltage signal.

12. The controller of claim 10 wherein the first input responds more slowly to a change in the mode of operation signal than the second input responds to changes in the voltage signal.

13. A method of operating a controller having a voltage supply node, a switching device, a powered component, a power supply detector, and a mode of operation including one of an on mode and an off mode, the method comprising:
receiving, by the power supply detector, a mode of operation signal indicative of the mode of operation of the controller;
determining, by the power supply detector, that the controller is in the off mode based on the mode of operation signal; and
controlling, by the power supply detector, the switching device to prevent a current from passing from the voltage supply node to the powered component responsive to determining that the controller is in the off mode.

14. The method of claim 13 further comprising controlling the switching device to prevent a current in excess of 1 µA from passing from the voltage supply node to the powered component responsive to determining that the controller is in the off mode.

15. The method of claim 13 further comprising:
determining, based on the mode of operation signal, that the controller is in the on mode;
receiving a first voltage signal from the voltage supply node;
determining that a magnitude of the first voltage signal is below a voltage threshold value; and
controlling the switching device to prevent a current from passing from the voltage supply node to the powered component responsive to determining that the magnitude of the voltage signal is below the voltage threshold value.

16. The method of claim 15 further comprising:
determining, based on the mode of operation signal, that the controller is in the on mode;
receiving a second voltage signal from the voltage supply node;
determining that a magnitude of the second voltage signal is above the voltage threshold value; and
controlling the switching device to allow a current to pass from the voltage supply node to the powered component responsive to determining that the magnitude of the second voltage signal is above the voltage threshold value.

17. The method of claim 13 further comprising:
determining, based on the mode of operation signal, that the controller is in the on mode; and
controlling the switching device to allow a current to pass from the voltage supply node to the powered component responsive to determining that the controller is in the on mode.

18. The method of claim 17 further comprising controlling the switching device to allow a current to pass from the voltage supply node to the powered component such that the switching device allows a current to pass from the voltage supply node to the powered component within 30 µs of receiving the mode of operation signal.

19. A method of operating a controller having a voltage supply node, a switching device, a powered component, and a mode of operation including one of an on mode and an off mode, the method comprising:
receiving a mode of operation signal indicative of the mode of operation of the controller;
determining that the controller is in the off mode based on the mode of operation signal;
controlling the switching device to prevent a current from passing from the voltage supply node to the powered component responsive to determining that the controller is in the off mode; and
allowing, by the switching device, a current to pass from the voltage supply node to the powered component in the absence of a biasing signal.

20. The method of 19 further comprising providing the biasing signal to the switching device to prevent the switching device from allowing a current to pass from the voltage supply node to the powered component.

* * * * *